(12) United States Patent
Su (10) Patent No.: US 8,295,409 B1
(45) Date of Patent: *Oct. 23, 2012

(54) SIGNAL MODULATION CLASSIFICATION DEVICE USING DISTRIBUTED SENSORS

(75) Inventor: Wei Su, Bel Air, MD (US)

(73) Assignee: The United States of America as Represented by the Secretary of the Army, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/325,124

(22) Filed: Dec. 14, 2011

Related U.S. Application Data (63) Continuation of application No. 12/148,076, filed on Apr. 15, 2008, now Pat. No. 8,085,882.

(51) Int. Cl.
*H03D 1/00* (2006.01)
*H04L 27/06* (2006.01)

(52) U.S. Cl. ........ 375/340; 375/346; 375/342; 375/343; 375/262

(58) Field of Classification Search .................. 375/340, 375/342, 343, 232, 220, 358, 360; 356/28, 356/30, 60

See application file for complete search history.

(56) References Cited

U.S. PATENT DOCUMENTS

| | | | | |
|---|---|---|---|---|
| 6,018,317 A | * | 1/2000 | Dogan et al. | 342/378 |
| 6,098,031 A | * | 8/2000 | Svetkoff et al. | 702/159 |
| 6,366,357 B1 | * | 4/2002 | Svetkoff et al. | 356/602 |
| 6,384,905 B1 | * | 5/2002 | Barrows | 356/28 |
| 6,697,633 B1 | * | 2/2004 | Dogan et al. | 455/509 |
| 7,233,392 B2 | * | 6/2007 | Margalith et al. | 356/300 |
| 8,085,882 B1 | * | 12/2011 | Su | 375/340 |

* cited by examiner

*Primary Examiner* — David Ometz
*Assistant Examiner* — Qutbuddin Ghulamali
(74) *Attorney, Agent, or Firm* — Stephen J. Harbulak (57) ABSTRACT

A multi-sensor signal fusion apparatus is provided for automatic modulation classification of weak unknown signals in non-cooperative communication environment with a more accurate description of the signal. The multi-sensor non-cooperative demodulation device combines a group of sensors, a signal fusion sensor, a means for signal demodulation, and a means for automatic modulation classification. An output of the signal fusion sensor is sent to a means for modulation scheme classification to select the appropriate demodulation technique for demodulating the unknown signal and provide the necessary intelligence about the monitored signals to the user and allow the user to simulate the unknown non-cooperative signal. The present invention also contemplates a multi-sensor signal fusion article of manufacture with a storage medium encoded with machine-readable computer program code for more accurate descriptions of monitored signals and methods for achieving higher accuracy descriptions of monitored signals in a non-cooperative environment with multi-sensor non-cooperative demodulation.

6 Claims, 10 Drawing Sheets

SIGNAL MODULATION CLASSIFICATION DEVICE USING DISTRIBUTED SENSORS

CROSS-REFERENCE TO RELATED APPLICATIONS

This application is a Continuation of U.S. patent application Ser. No. 12/148,076, which was filed on Apr. 15, 2008, and which issued as U.S. Pat. No. 8,085,882. This Continuation is being filed under 35 U.S.C. Section 120, and priority from that previous application is hereby claimed, and that application is incorporated herein by reference in its entirety.

GOVERNMENT INTEREST

The invention described herein may be manufactured, used, imported, sold, and licensed by or for the Government of the United States of America without the payment to me of any royalty thereon.

FIELD OF THE INVENTION

The invention generally relates to signal collection networks. In particular, the invention relates to signal monitoring apparatus and methods based on multi-sensor fusion for modulation classification of weak signals.

BACKGROUND OF THE INVENTION

Non-cooperative demodulation is a technique to demodulate communication signals without hand shaking between the transmitter and the receiver. This technique has been widely used in both military and commercial communications, battlefield surveillance, hostile signal detection, and signal monitoring. In non-cooperative communications, the receiver has no knowledge, or only has limited knowledge of the transmitting signal, for example the signal monitoring devices may not know the format of the signal being monitored in tactical or hostile environment involving military or law enforcement operations. Non-cooperative demodulation will be used in non-cooperative communication.

Automatic modulation classification is a key component in non-cooperative demodulation for recognizing the modulation scheme of a transmitted signal without prior knowledge of the signal ground truth and cueing the software-defined radio to choose the proper built-in demodulator. Although significant research has been conducted on automatic modulation classification methods during the last two decades, this research has been limited to single receiver situations where the classification performance and recognition of a successful rate have largely depended on channel quality and the receiver signal strength. These conditions do not ordinarily apply to non-cooperative communications because in a non-cooperative communication environment, particularly in military applications, the received signal at the single sensor is usually very weak so that the single sensor modulation classification of an unknown weak signal is usually difficult and unreliable.

Further, prior art automatic modulation classification devices and methods do not adequately account for multiple receiver situations such as sensor networks, whose uses have become more and more popular. Due to the dramatic and widespread use of sensor networks, single sensor monitoring is now considered to be inadequate.

Thus, there has been a long-felt need for better signal monitoring techniques that lead to more effective modulation classification of weak signals without suffering from the limitations, shortcomings and difficulties of single receiver configurations such as receiving weak signals and classifying the unknown weak signal.

SUMMARY OF THE INVENTION

In order to meet the long-felt need for more effective signal monitoring and improved demodulation, without suffering from the limitations, shortcomings and difficulties of prior art configurations, this invention's multi-sensor signal fusion devices and methods combine signals from multiple sensors to provide descriptions of the monitored signals that are more accurate than single signal demodulation. Multi-sensor signal fusion offers increased reliability and huge gains in overall performance compared to the single-sensor demodulation so that the automatic modulation classification of weak signals in non-cooperative communication environment could be stronger and more reliable. This invention's multi-sensor signal fusion devices also take advantage of the latest techniques for improving geo-location accuracy and eliminating the channel distortion of the transmitted signals.

Thus, it is an object of the present invention to provide a multi-sensor signal fusion apparatus for automatic modulation classification of an unknown signal.

Another object of the present invention is to provide a multi-sensor signal fusion apparatus for automatic modulation classification that provides a more accurate description of an unknown signal.

It is a further object of the present invention to provide a multi-sensor signal fusion apparatus for automatic modulation classification of weak signals in a non-cooperative communication environment that provides a more accurate description of an unknown signal.

These and other objects and advantages can now be attained by this invention's multi-sensor non-cooperative demodulation device comprising a group of sensors, a signal fusion sensor, a means for signal demodulation, and a means for automatic modulation classification. An output of the signal fusion sensor is sent to a means for modulation scheme classification to select the appropriate demodulation technique for demodulating the unknown signal to provide the necessary intelligence about the monitored signals to the user. This invention's multi-sensor non-cooperative demodulation device, system and methods provide more accurate descriptions of monitored signals in a non-cooperative environment without suffering from the disadvantages, shortcomings and limitations of prior art techniques and devices.

The present invention also contemplates a multi-sensor signal fusion article of manufacture with a storage medium encoded with machine-readable computer program code for more accurate descriptions of monitored signals and methods for achieving higher accuracy descriptions of monitored signals in a non-cooperative environment with multi-sensor non-cooperative demodulation.

DETAILED DESCRIPTION OF THE DRAWINGS

Figure 1:
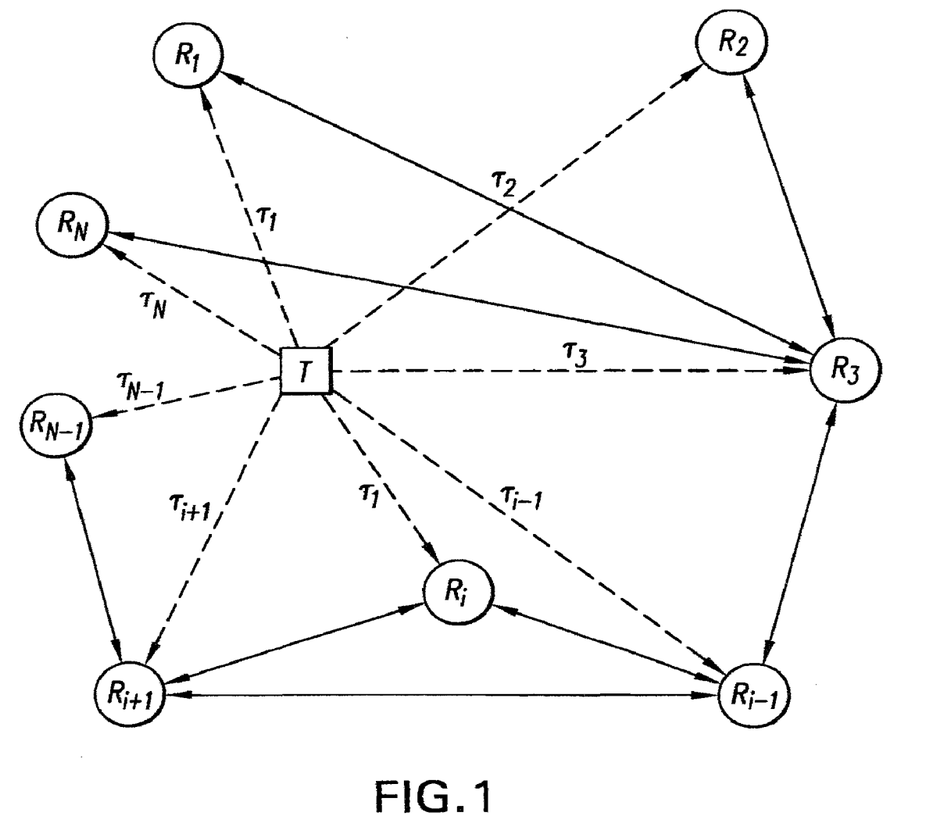
FIG. 1 is a diagram illustrating a typical communication sensor network.

In accordance with the present invention, fusing multiple signals in connection with non-cooperative demodulation affords a more effective demodulation without suffering from the limitations, shortcomings, and difficulties of single receiver configurations, such as receiving weak signals and classifying the unknown weak signal. FIG. 1 is a diagram illustrating a typical communication sensor network with an unknown transmitter T and N number of communication sensors, denoted by $R_1$, $R_2$, . . . , and $R_N$. The unknown transmitted signal is transmitted by a transmitter T and is collected by sensors $R_1$, $R_2$, . . . , and $R_N$ non-cooperatively. In this diagram, the sensors can communicate with each other cooperatively, but they do not need to be fully connected. The sensors have no hand-shaking with the unknown transmitter, T.

Figure 2:
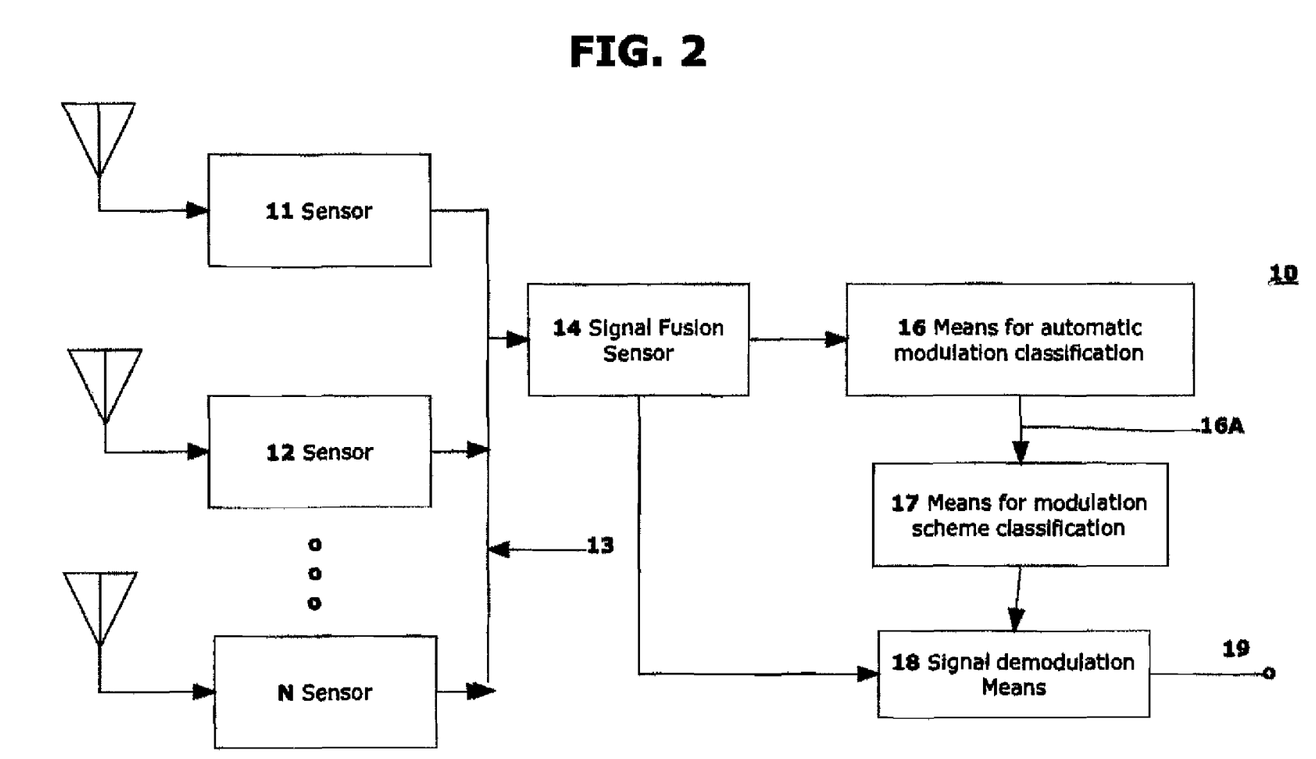
FIG. 2 is a conceptual block diagram depicting a simplified version of the multi-sensor non-cooperative demodulation device in accordance with the present invention.

FIG. 2 is a conceptual block diagram depicting a simplified version of the multi-sensor non-cooperative demodulation device 10, comprising a group of sensors, a signal fusion sensor, a means for signal demodulation that generates a demodulated signal, and a means for automatic modulation classification to estimate a modulation scheme. Referring now to FIG. 2, multiple sensors 11, 12, and N receive non-cooperative signals, from an unknown transmission source. The sensors 11, 12 and N, each have a sampling clock to digitize the received signals and a local memory to store the received signals, $r_{0i}$, 13 in the form of signal packets. Denoting the unknown signal as s(t), the received signal, $r_{0i}$, 13, at the $i^{th}$ sensor is described by the following expression:

$$r_{0i}(t)=\alpha_{0i}(t)s(t-\tau_i)+n_{0i}(t)+I_{0i}(t) \quad \text{Equation (1)}$$

where $\alpha_{0i}(t)$ is the channel attenuation between the transmitter T and receiver $R_i$, $n_{0i}(t)$ is the additive noise with a zero mean between the transmitter T and receiver $R_i$, and $I_{0i}(t)$ is a combination of random interferences between the transmitter T and receiver $R_i$. The received signals 13 are combined in a signal fusion sensor 14 that extracts the weak signals and generates a combined, or fused, digitized signal 15. The received signal at the first sensor 11 digitizes a short time duration, or fragment, of the received signal $r_{0i}(t)$ to K samples, which are time-stamped and stored in the local memory as a packet. Let $t=kT_s$, in EQ. 1, the digitized signal at the first receiving sensor 11 can approximately be described by:

$$r_{01}(kT_s)=\alpha_{01}(kT_s)s((k-m_1)T_s-\delta_{01})+n_{01}(kT_s)+I_{01}(kT_s) \quad \text{Equation (2)}$$

where k=1, 2, . . . , K, $T_s$ is the sampling time-period, $m_{01}$ is a positive integer contributed by the transmission time-delay, and $\delta_{01}$ is a decimal number between $-0.5\ T_s$ and $0.51\ T_s$ related to the reminder of $\tau_i/T_s$. The digitized received signals from all sensors, 11, 12, and N are combined at the signal fusion sensor 14 to form the combined digitized signal 15 which is sent to a means for automatic modulation classification 16 to estimate a modulation scheme that simulates the modulation of the unknown signals, s(t).

An output estimate 16A is sent to a means for modulation scheme classification 17 that selects the appropriate demodulation technique for demodulating the unknown signals, s(t), such as PSK8, FSK2 and QAM16. The signal demodulation means 18 classifies the unknown signals, s(t), and provides a demodulated signal 19 with improved fidelity and reliability allowing the user to better conduct hostile signal detection, surveillance, and monitoring.

This invention's multi-sensor demodulation device 10 eliminates signal variables such as the power of the channel noise, disturbances and combined interference by taking advantage of the spatial diversity and randomness of those unknown terms and digitizing a fragment of the received signal $r_{0i}(t)$ to K samples. The resolution of the combined digitized signal 15 depends upon the sampling rate. Since the sampling clocks at the receiving sensors 11, 12 and N are asynchronous and jittering in a given time frame, the digitized receiving signals $r_{0i}(kT_s)$ have a small time offset referencing to the first receiving sensor 11. It is reasonable to assume the sampling time-period $T_s$ is fixed within the analysis time frame, the signal $r_{0i}(kT_s)$ can be described by $$r_{0i}(kT_s-d_{0i})=\alpha_{0i}(kT_s-d_{0i})s((k-m_i)T_s-\delta_{01})+n_{0i}(kT_s-d_{0i})+I_{0i}(kT_s-d_{0i}) \quad \text{Equation (3)}$$

where $d_{0i}$ is the time-synchronization offset, $\delta_{0i}$ is a decimal number between $-0.5\ T_s$ and $0.5\ T_s$, which is a remainder related to time-quantization, time-synchronization, and time-jittering. Since the communication between T and $R_i$ is non-cooperative, the channel equalization and signal recovery at each single sensor is very difficult.

For simplification, denoting $$r_{0i}(k)=r_{01}(kT_s-d_{0i}),\ \alpha_{0i}(k)=\alpha_{0i}(kT_s-d_{0i}),\ n_{0i}(k)=n_{0i}(kT_s-d_{0i}),\ \text{and}$$

$$I_{0i}(k)=I_{0i}(kT_s-d_{0i})$$

and combining EQ. 2 and EQ. 3 results in the expression:

$$r_{0i}(k)=\alpha_{0i}(k)s((k-m_i)T_s-\delta_{0i})+n_{0i}(k)+I_{0i}(k) \quad \text{Equation (4)}$$

where i=1, 2, . . . , N, and $\delta_{1,1}=0$. In this simplified embodiment, the first receiving sensor, $R_1$, or 11, functions as a master and all other sensors: $R_2$, $R_3$, . . . , $R_N$ (12 and N) function as slaves passing the received signal packets from the local memories to the master in various relay routes for data fusion. The communications between the master and slaves can be wired or wireless.

The cooperation between the master and slaves is a critical element of the signal fusion aspect of the present invention. The signal transmission from slaves to the master is asynchronous in time since all data fragments are sent as packets. Furthermore, when the communications between sensors are cooperative, the channel distortion to the data transmission can be compensated for and the data can be recovered reliably by using various existing techniques such as error coding, interleaving, and equalization. The received packet at the master contains K signal samples, which are described by:

$$r_i(k) = a_{i1}(k)r_{0i}(k) + n_{i1}(k) + I_{i1}(k) \quad \text{Equation (5)}$$
$$= a_i(k)s((k-m_i)T_s) + \Delta s_i(k) + n_i(k) + I_i(k)$$

where $k=1, 2, \ldots, N$, $a_i(k)=a_{i1}(k)a_{0i}(k)$, $n_i(k)=n_{0i}(kT_s-d_{0i})+n_{i1}(k)$, $I_i(k)=I_{0i}(kT_s-d_{0i})+I_{i1}(k)$, $n_{i1}(k)$ is the additive channel noise between the $i^{th}$ slave and the master with $n_{1,1}(k)=0$, and $I_{i1}(k)$ represents the random combined disturbances between the $i^{th}$ slave and the master with $I_{1,1}(k)=0$. The following term describes the signal distortion due to digitization:

$$\Delta s_i(k) = a_{i1}(k)a_{0i}(k)s((k-m_i)T_s - \delta_{0i}) - a_i(k)s((k-m_i)T_s) \quad \text{Equation (6)}$$

After the master takes all packets from the memories of $R_2$, $R_3, \ldots R_N$, the signal samples are aligned and combined into a single signal. Various methods can be used in aligning and combining signals. One way is to shift the waveform with an estimated delay of $\hat{m}_i$, $i=2, \ldots, N$, and $\hat{m}_1=0$, and calculate the expectation of all shifted signals as described by these equations:

$$y(k) = \frac{1}{N-1}\sum_{i=1}^{N} r_i(k+\hat{m}_i) \quad \text{Equation (7)}$$
$$\approx \left(\frac{1}{N-1}\sum_{i=1}^{N} a_i(k)\right)s(kT_s) + \frac{1}{N-1}\sum_{i=1}^{N}\Delta s_i(k+\hat{m}_i) +$$
$$\frac{1}{N-1}\sum_{i=1}^{N} n_i(k+\hat{m}_i) + \frac{1}{N-1}\sum_{i=1}^{N} I_i(k+\hat{m}_i)$$
$$= A(k)s(kT_s) + \Delta S(k) + L(k) + I(k)$$

where $$A(k) = \frac{1}{N-1}\sum_{i=1}^{N} a_i(k), \Delta S(k) = \frac{1}{N-1}\sum_{i=1}^{N}\Delta s_i(k+\hat{m}_i),$$
$$L(k) = \frac{1}{N-1}\sum_{i=1}^{N} n_i(k+\hat{m}_i), \text{ and}$$
$$I(k) = \frac{1}{N-1}\sum_{i=1}^{N} I_i(k+\hat{m}_i).$$

The estimation of $\hat{m}_i$, $i=2, \ldots, N$, depends on the over-sampling rate. A high over-sampling rate gives a more accurate delay value of $\hat{m}_i$. When the over-sampling rate is low, interpolation and re-sampling can be advantageously used to improve the accuracy of $\hat{m}_i$. It is noted that the terms $\Delta s_i(k)$, $n_i(k)$, and $I_i(k)$ are eliminated by taking averages. If all of those terms have zero means, and $A(k)$ approaches a constant number $A$, we have $\Delta S(k)+L(k)+I(k) \rightarrow 0$ and $A(k) \rightarrow A$ when the number of receiving sensors 11, 12 and N is large, that is $N \rightarrow \infty$. This yields the following expression:

$$y(k) \approx A \cdot s(kT_s) \quad \text{Equation (8)}$$

The weak signal $s(kT_s)$ is then recovered from the noisy channels by using the multi-sensor network systems of the present invention.

Usually, a preprocessing operation is needed to exclude the outlier packets based on the estimated signal-to-noise ratios (SNRs) and to normalize the packets based on the signal powers before estimating the delay factor and combining the signals. Thus, the multi-sensor demodulation device 10 provides signal fusion, automatic demodulation, modulation scheme classification, and the appropriate demodulation technique to effectively monitor the collected non-cooperative unknown signals without suffering form the disadvantages, shortcomings, and limitations of prior art techniques and devices.

Figure 3:
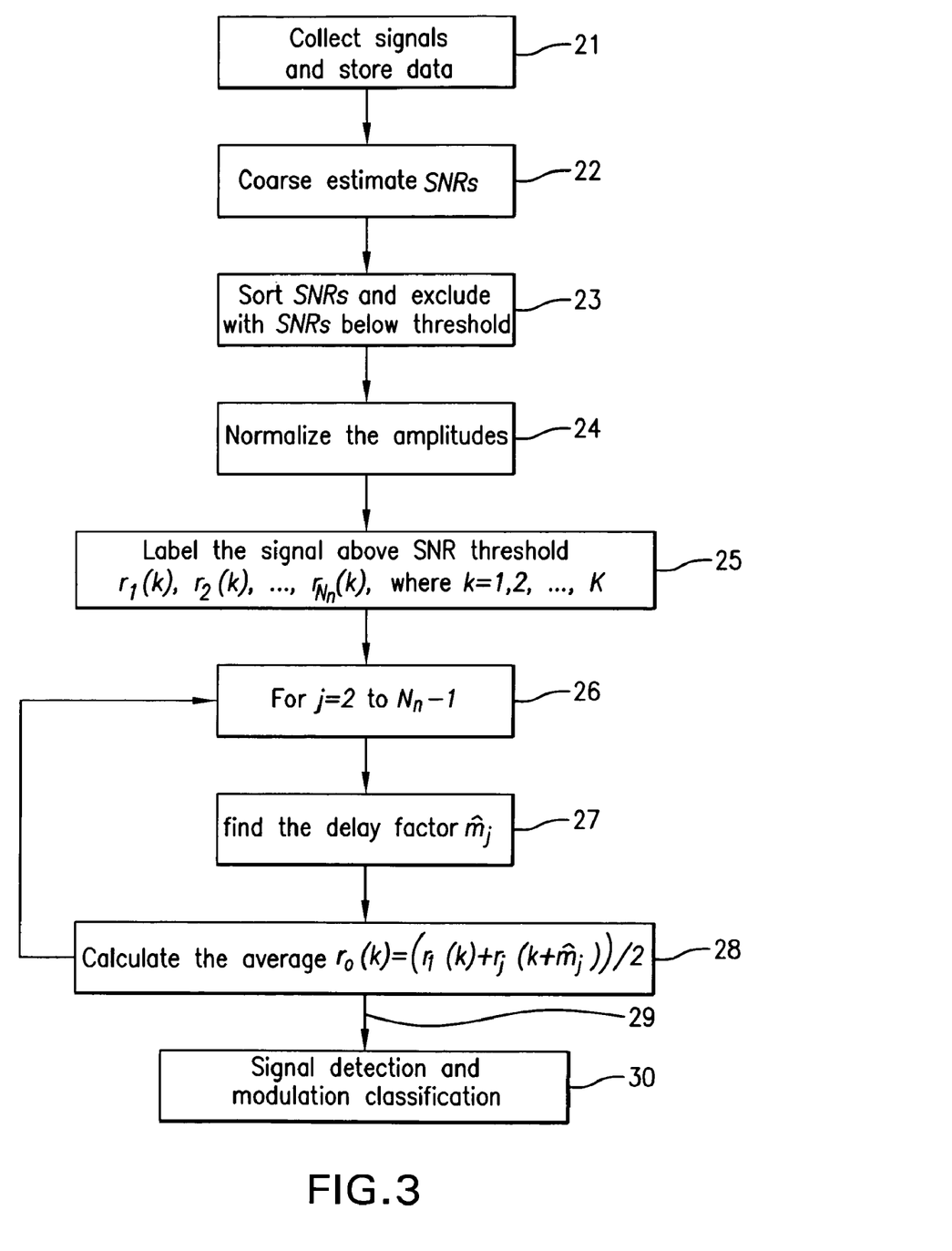
FIG. 3 is a software programming flowchart depicting software operations of non-cooperative demodulation in accordance with the present invention.

This invention can be implemented in either in hardware or software. FIG. 3 is a software programming flowchart that illustrates the operation of software in this invention's multi-sensor signal fusion article of manufacture with a storage medium encoded with machine-readable computer program code for more accurate descriptions of monitored signals. The software programming flowchart depicts the software operations of the signal preprocessing, delay factor estimation, and signal combining processes.

Referring now to FIG. 3, when this invention is implemented with software, the software operation begins with collecting signals in a means for collecting signals and storing data represented by Block 21, where signals collected from multiple sensors are transmitted to a digital signal processing unit in the master and stored in the memory for processing. In Block 22, a coarse SNR estimation is conducted in a means for coarse estimation in order to eliminate the outliers based on the SNR threshold. In a means for sorting represented by Block 23, the SNRs are sorted from high to low, and signals with a SNR below a given threshold are excluded. In Block 24 a means for normalization normalizes signals above a given threshold, and in a means for signal labeling, represented by Block 25, the signals are labeled from 1 to $N_n$, that is $r_j(k)$, $j=1, 2, \ldots, N_n$, based on the estimated values of SNRs. Here the index j is not related to the indices of the sensors. In Block 26 a means for correlating receives the signal with the highest SNR, $r_1(k)$, and correlates it with $r_2(k)$ to obtain the delay factor $\hat{m}_2$ in Block 27. In Block 28, a means for calculating averages $r_1(k)$ and $r_2(k+\hat{m}_2)$, which are defined as $r_a(k)$ and continuing the similar process, as shown in FIG. 3, for $r_3(k)$, $r_4(k), \ldots, r_N(k)$ finishes the looping process with the Block 26 correlating means and Block 27 delay factor resulting in a combined signal 29 fed to a signal detection and modulation classification block 29 for estimating the modulation scheme. Many of the variations of the multi-sensor demodulation device also apply to this invention's article of manufacture software embodiment.

Figure 4A:
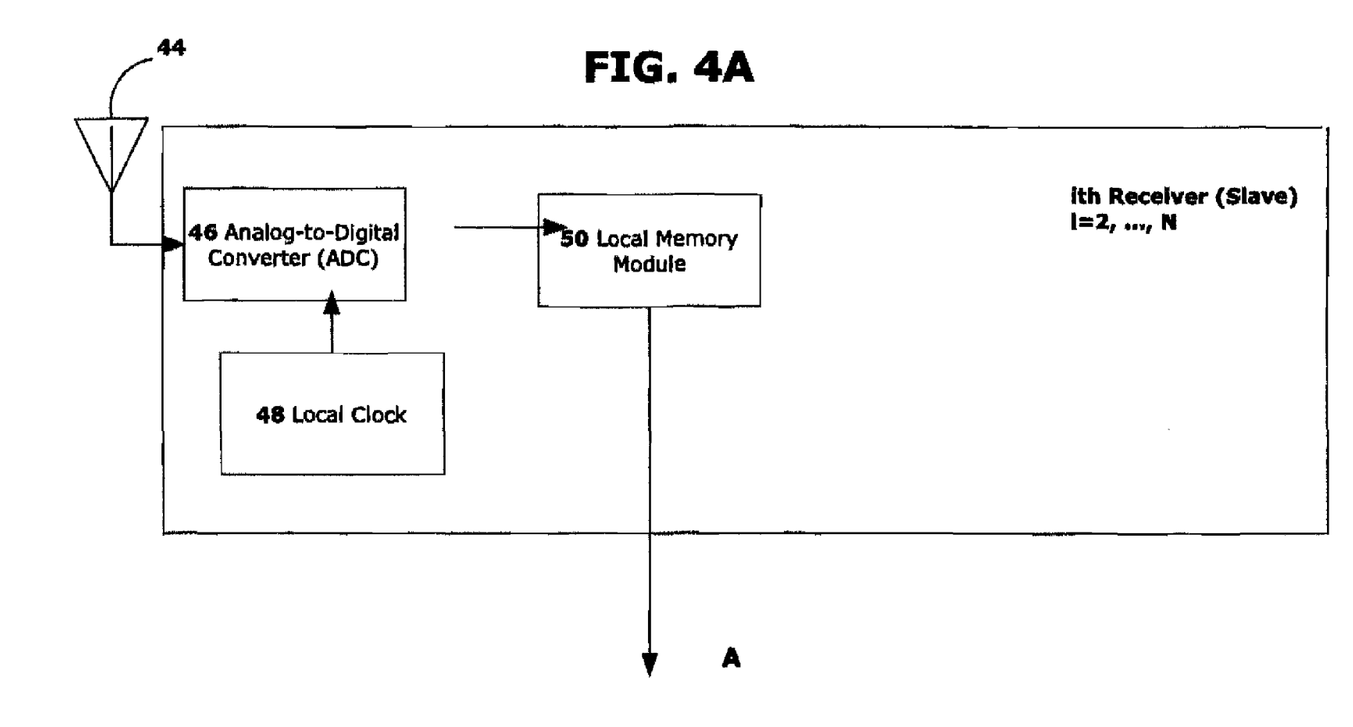
FIGS. 4A and 4B show a conceptual block diagram illustrating multi-sensor signal fusion with master and slave sensors in accordance with the present invention.
Figure 4B:
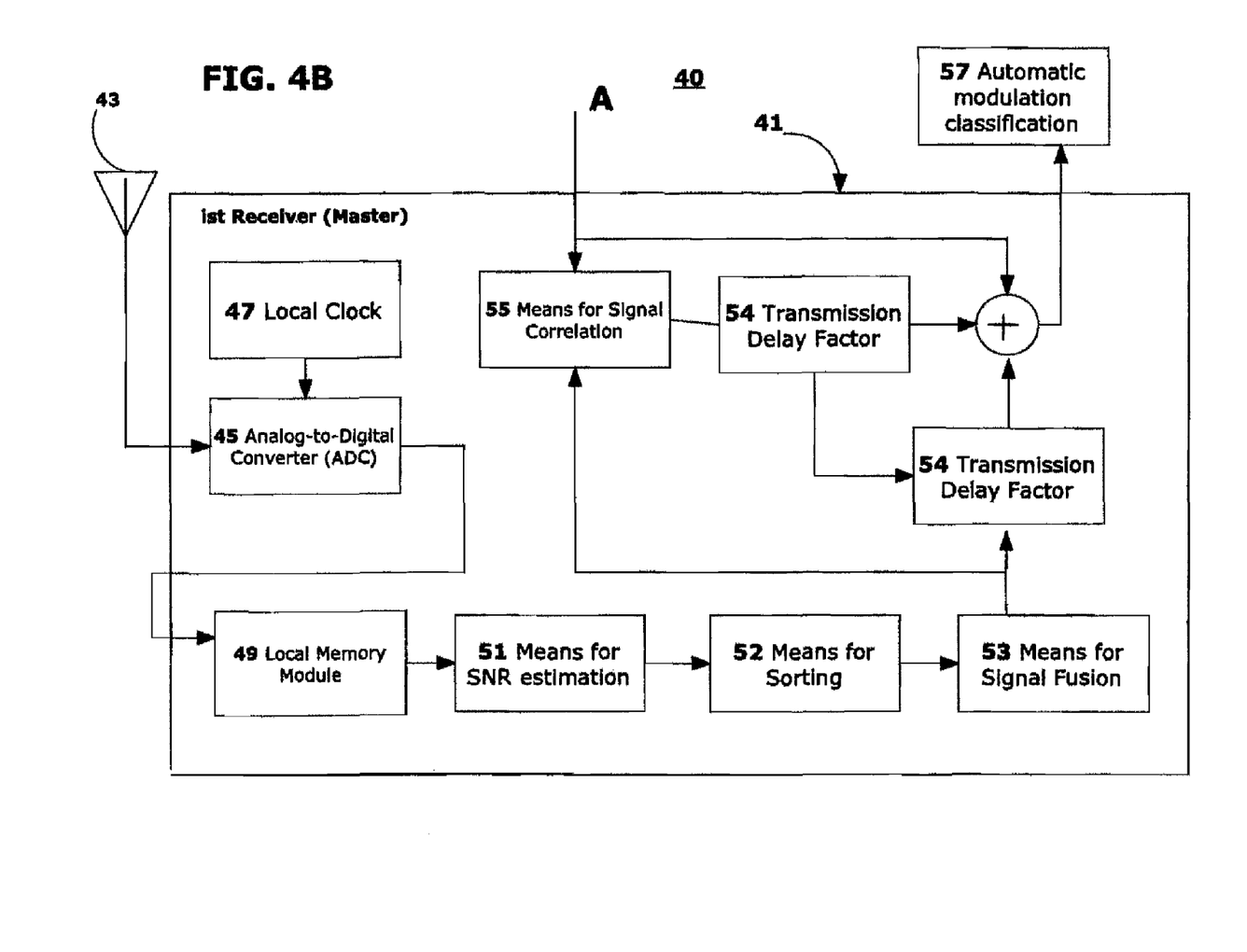

FIGS. 4A and 4B show a conceptual block diagram of another hardware implementation of the multi-sensor non-cooperative demodulation device 40 of the present invention that provides more detail concerning the signal preprocessing, delay factor estimation, and signal combining aspects of the device with master and slave components. This embodiment provides a first, or master, sensor 41 and an $i^{th}$, or slave, sensor 42.

The signals are collected by sensor antennas 43 and 44, sent to Analog-to-Digital Converters 45 and 46 and then digitized by a local clock 47 and 48 where i, $i=1, 2, \ldots, N$, and saved in a local memory module 49 and 50. The master sensor 41 collects the multiple signal packets from local memories, then estimates coarse SNRs in a means for SNR estimation 51, excludes outliers in a means for sorting 52, and then normalizes all the signals in a means for signal fusion 53. A transmission delay factor 54 is estimated and then the signals are correlated in a means for signal correlation 55. Interpolation and over-sampling will be applied if needed. The signals are shifted and combined in a means for signal combining 56 before feeding to the automatic modulation classification block 57. FIGS. 4A and 4B only demonstrates two sensors, one is the master and the other is the slave. The same architecture works for a large sensor network with massive numbers of slaves. Parallel processing can be used for estimating the delay factor and combining signals. Multiple master sensors can be used to distribute the signal fusion process in accordance with the present invention. Many of the variations of the multi-sensor demodulation device also apply to this invention's master/slave sensor configurations.

Figure 5A:
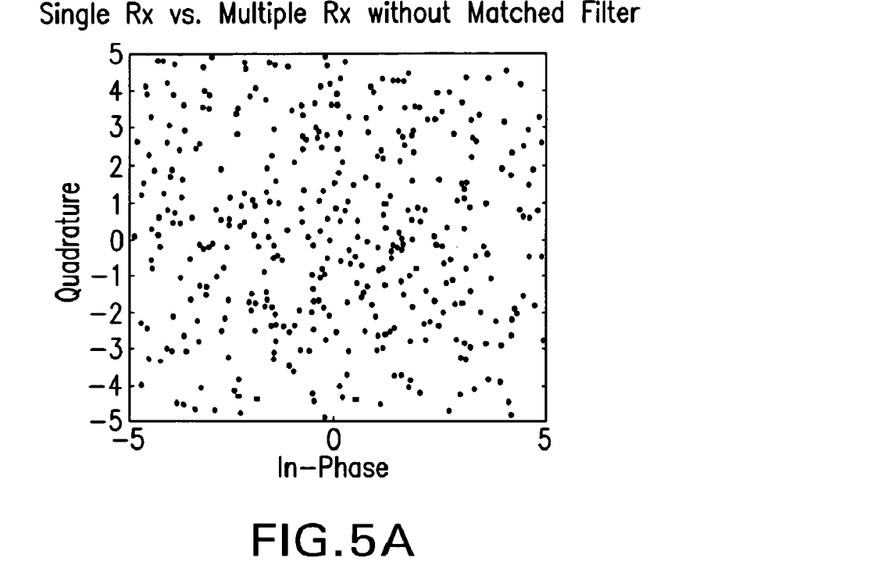
FIG. 5A is a chart illustrating the simulation result of a single sensor with a matched filter.
Figure 5B:
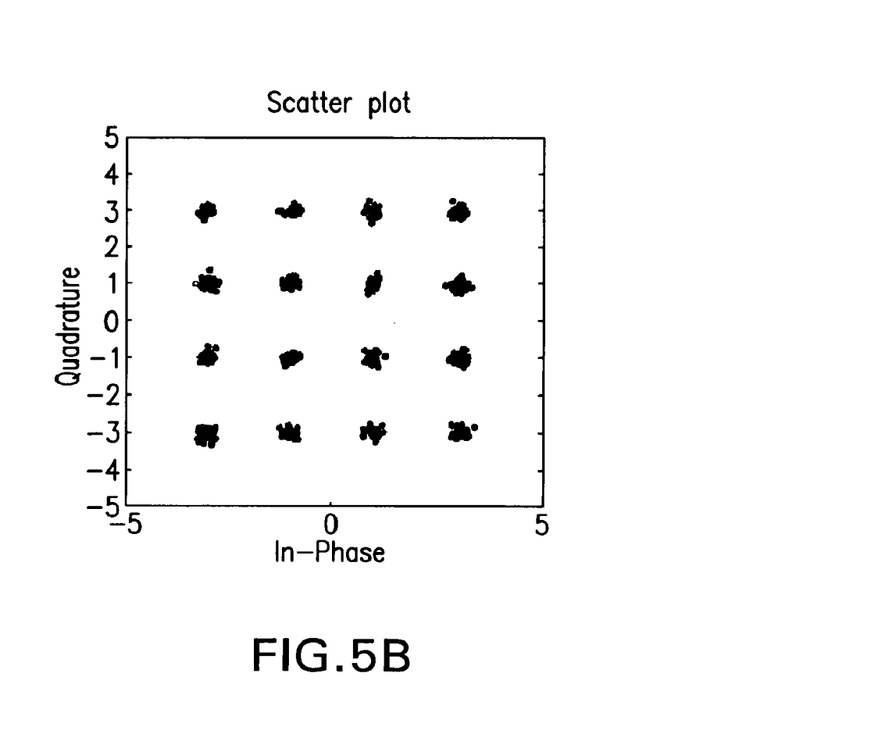
FIG. 5B is a chart illustrating the simulation result of multi-sensor signal fusion with a matched filter.

Referring now to the drawings, FIGS. 5A and 5B are charts illustrating simulation results of a single sensor and a multi-sensor signal fusion with matched filters that demonstrate the advantages in using multi-sensor signal fusion in accordance with this invention. The computer simulations were conducted by combining signals received from 100 receiving sensors. The SNR ratio and signal length at each single sensor is 0 dB and 512 samples, respectively. The signals are modulated as 16 QAM with root-raised-cosine filters. The roll-off factor is 0.25 and the over-sample rate is 4 samples per symbol. In order to simplify the simulations, all signals were digitized synchronously in time and modulation phase. The results of these computer simulations are shown in FIGS. 5A and 5B. The dots in FIG. 5A are recovered symbols at a single sensor which are very noisy, and are not recognizable for any constellation pattern. By contrast, the FIG. 5B multi-sensor signal fusion dots are arranged in a much clearer constellation pattern of 16 clusters. Therefore, the unknown signal is classified as QAM16 modulation scheme.

Figure 6:
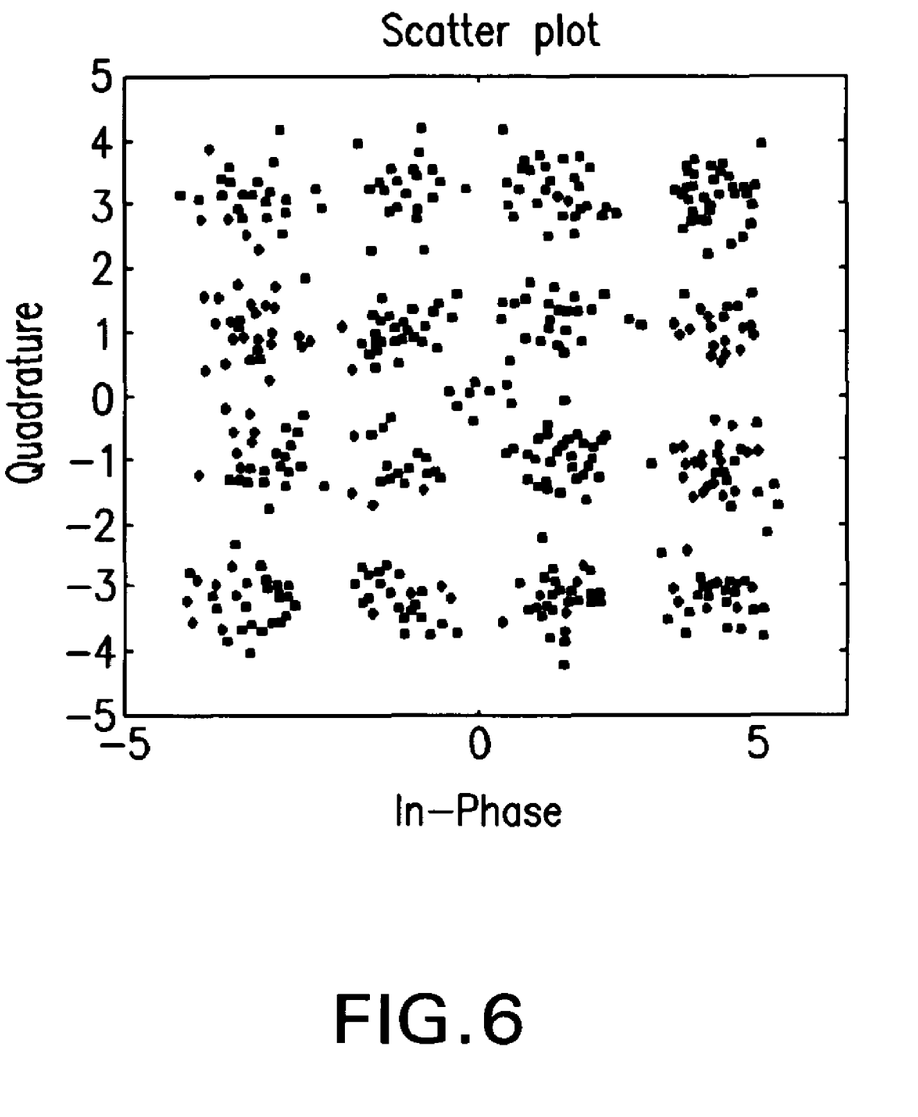
FIG. 6 is a chart illustrating the simulation result of multi-sensor signal fusion without matched filters.

Matched filters were used in the FIG. 5A and FIG. 5B simulations. FIG. 6 illustrates the simulation result of multi-sensor signal fusion without matched filters because in most non-cooperative communication operations, the structure of the matched filter is not always known so the matched filter cannot be used in those situations. The dots in FIG. 6 are the recovered symbols after multi-sensor signal fusion with no matched filter. Although the 16 clusters in FIG. 6 are not as concentrated as those in FIG. 5B, those skilled in the art should readily recognize them and classify the unknown signal as the QAM16 modulation scheme. After comparing the FIG. 5A single sensor results with the FIG. 5B and FIG. 6 multi-signal fusion results, it is readily apparent that the FIG. 5A single sensor modulation scheme at SNR=0 dB is almost impossible to discern, while the FIG. 5B and FIG. 6 multi-sensor results quite readily allow estimating the modulation scheme, even if the SNR is quite low.

The multi-sensor signal fusion technique can be developed in various implementations and embodiments. The concept applies to both analog and digital signals in any wired or wireless communication network with various architectures, to a wide frequency range, and to the channels in harsh environments.

Figure 7A:
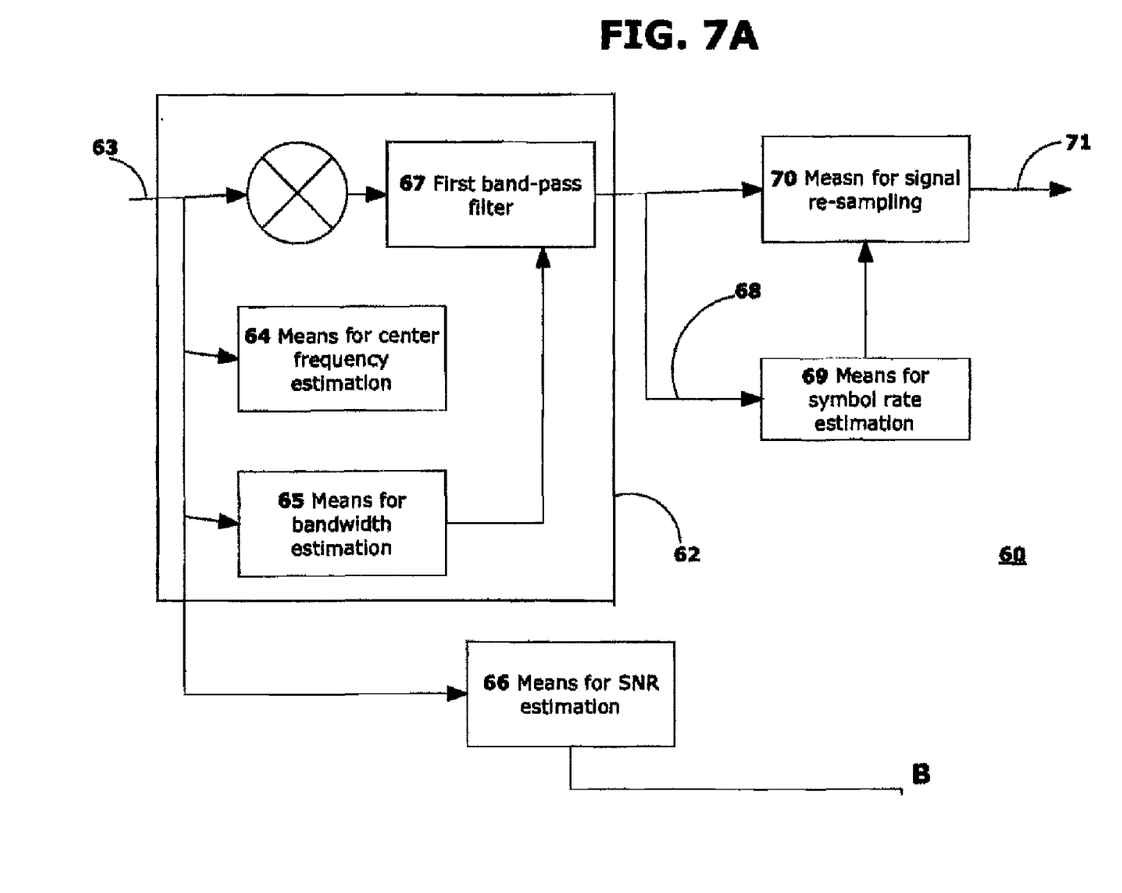
FIGS. 7A and 7B show a conceptual block diagram depicting automated modulation classification for linear communication signals in accordance with the multi-sensor non-cooperative demodulation device of the present invention.
Figure 7B:
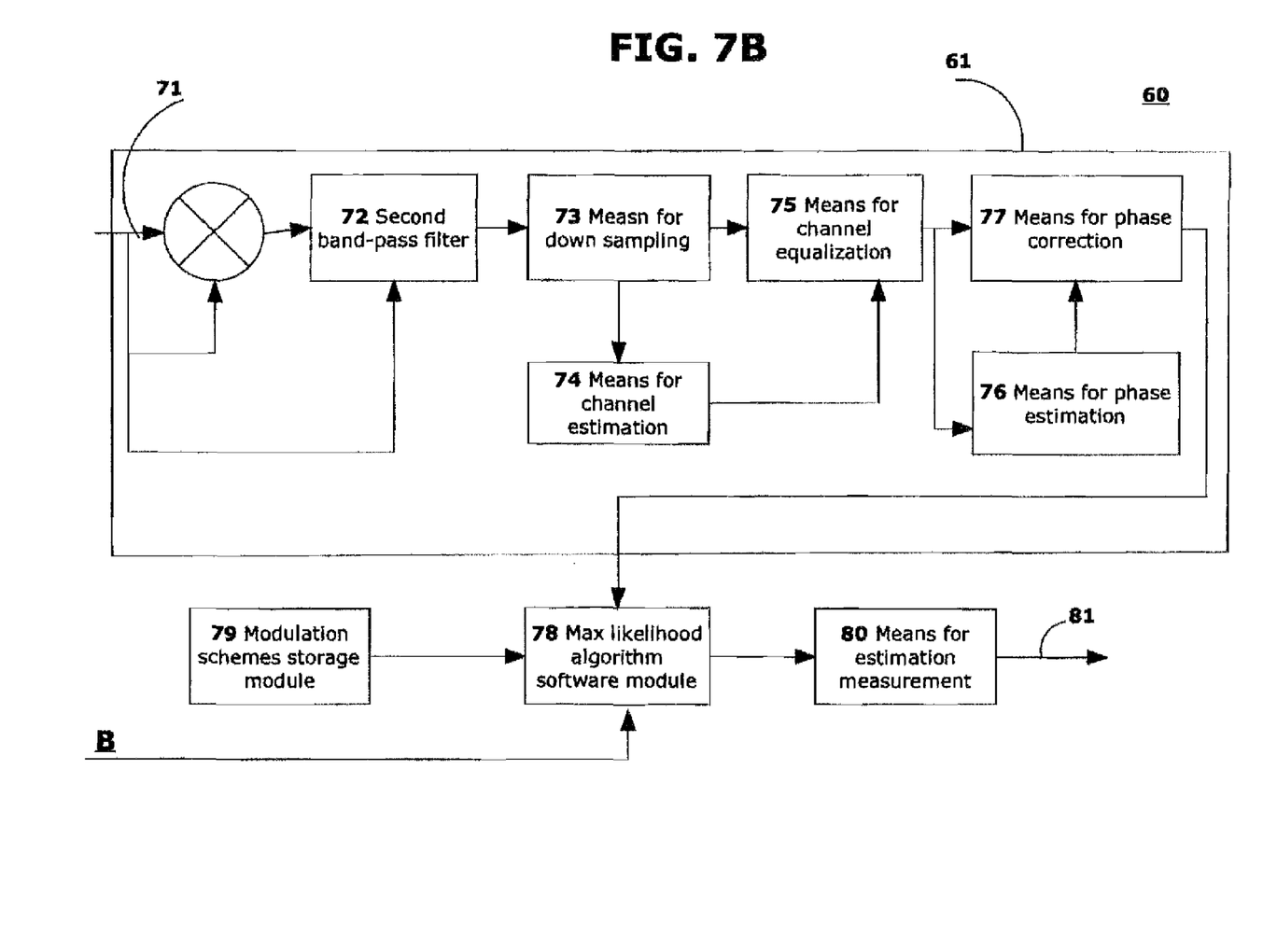

FIGS. 7A and 7B show a conceptual block diagram depicting a multi-sensor non-cooperative linear digital signal classification device 60 for classifying linear digital signals including M-ary PSK and M-ary QAM modulation schemes in accordance with the present invention. This embodiment illustrates the processing sequence of the estimations of center frequency, bandwidth, SNR, and symbol rate, and gives a top-level view of automatic modulation classification of linearly modulated digital signals. The automated modulation classification includes, but is not limited to, analog, linear and nonlinear digital, and various multiple carrier signals.

This multi-sensor non-cooperative linear digital signal demodulation device 60 comprises a coarse modulation parameter estimation unit 62 and a fine modulation parameter estimation unit 61. The signals are collected by sensor antennas and combined by a signal fusion means not shown in this drawing. Referring now to the coarse estimation unit 62, the fused multi-sensor signal 63 is used for coarse estimations of the center frequency in a means for center frequency estimation 64, coarse estimations of bandwidth in a means for bandwidth estimation 65, and coarse SNR estimations in a means for SNR estimation 66. The signal is down-converted and filtered in a first band-pass filter 67 based on the coarse estimations of the center frequency and bandwidth. Then a filtered signal output 68 is provided to a means for symbol rate estimation 69 and a means for signal re-sampling 70 to the integer number of samples per symbol. The signal re-sampling means 70 sends a sampled, filtered output 71 to the fine modulation parameter estimation unit 61, which functions as a master sensor.

Referring now to the fine estimation unit 61, or master sensor, the residual center frequency is removed from the sampled, filtered output 71 and the signal is mixed and filtered once again with a second band pass filter 72 that is tighter than the first band pass filter 67. The twice-filtered output signal is down sampled to the symbol rate, if needed, in a means for down-sampling 73 before channel estimation is performed in a means for channel estimation 74 and before channel equalization occurs in a means for channel equalization 75. The modulation phase offset is estimated in means for phase estimation 76 and corrected in a means for phase correction 77. A maximum likelihood algorithm software module 78 estimates the most likely modulation scheme based on the estimated SNR and possible modulation schemes stored in a modulation schemes storage module 79. The confidence of the modulation estimation is measured in a means for estimation measurement 80 and estimation results, including modulation scheme, SNR, bandwidth, symbol rate, center frequency residual, and estimation confidence, are reported in final estimate, represented by arrow 81 once the multi-sensor signal is obtained and combined. The automatic modulation classification does not depend on, and is not limited to, the signal fusion methods. In other words, any existing or new automatic modulation classification methods can be used in this invention. Many of the variations of the multi-sensor demodulation device also apply to this invention's multi-sensor non-cooperative linear digital signal demodulation embodiment.

Figure 8:
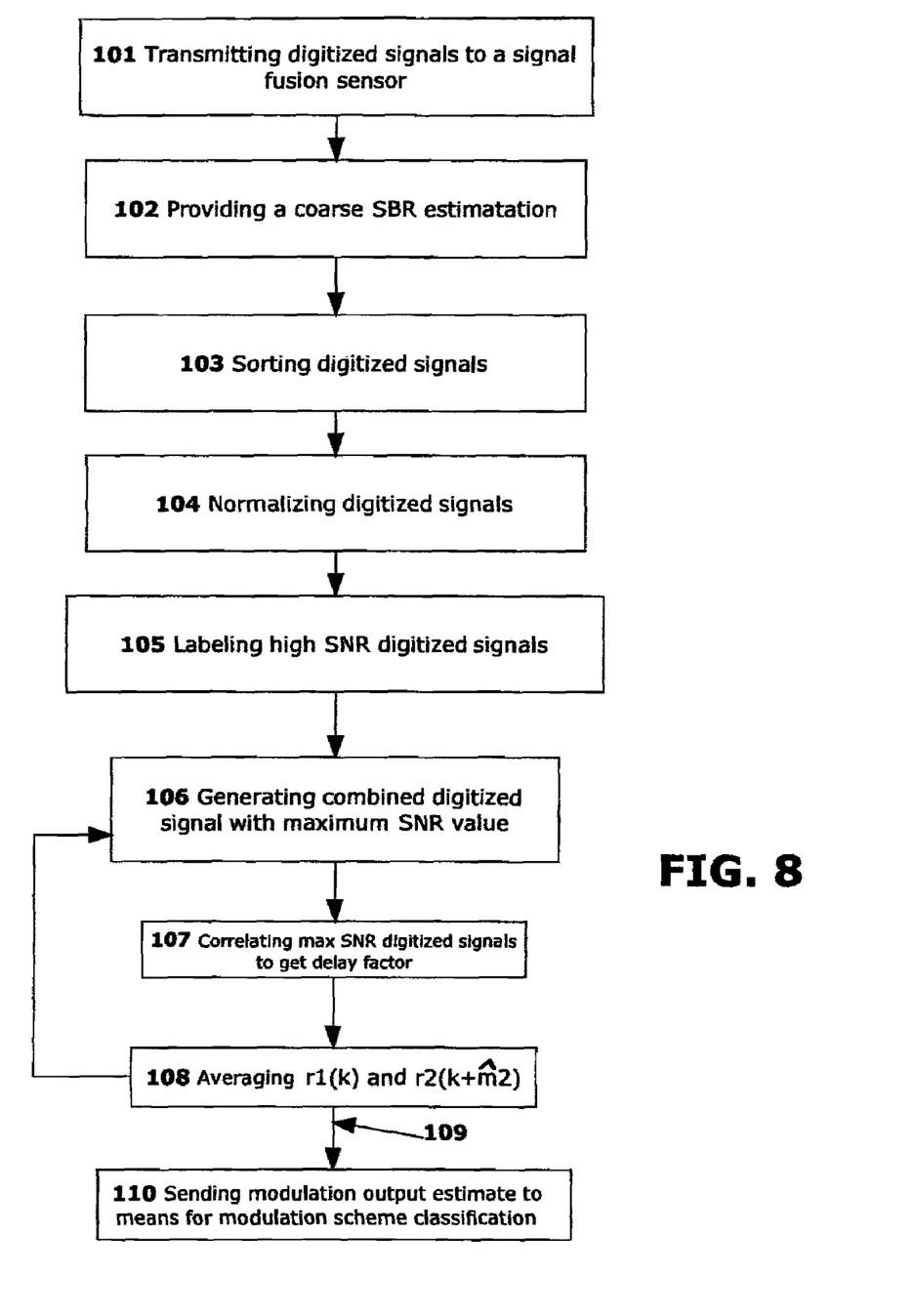
FIG. 8 is a flowchart depicting the steps of the method for achieving higher accuracy descriptions of monitored signals in a non-cooperative environment with multi-sensor non-cooperative demodulation in accordance with the present invention.

Referring now to FIG. 8, there is depicted a flow diagram of the steps of this invention's method for achieving increased fidelity and more reliable simulation of monitored non-cooperative signals with multi-sensor non-cooperative demodulation comprising the steps of receiving non-cooperative signals, s(t), from an unknown transmission source in a group of sensors, each of the sensors having a sampling clock and a local memory, with the non-cooperative signals having weak signals, a given modulation and a given demodulation; digitizing a group of received signals with the group of sensors; providing digitized signals, with the digitized signals including the multiple non-cooperative signals; and transmitting the digitized signals to a signal fusion sensor, which are represented by Block 101. The step of providing a coarse SNR estimation from a means for coarse estimation to extract the weak signals based on a coarse SNR threshold is represented by Block 102 and the step of sorting the digitized signals according to an SNR value below a given threshold in a means for sorting is represented by Block 103. The step of normalizing digitized signals with SNR above a given threshold is represented by Block 104, and the step of labeling the high SNR digitized signals in a means for signal labeling based on multiple estimated SNR values is represented by Block 105.

This invention's method continues with the steps of generating a combined digitized signal with a maximum SNR value, $r_1(k)$, in a means for correlating, represented by Block 106; correlating the maximum SNR digitized signals with $r_2(k)$ to obtain a delay factor $\hat{m}_2$, represented by Block 107; averaging $r_1(k)$ and $r_2(k+\hat{m}_2)$ in a means for calculating, represented by Block 108; and transmitting a combined digitized signal to a means for automatic modulation for a modulation output estimate, represented by Block 109. Block 110 represents the final steps of sending the modulation output estimate to a means for modulation scheme classification that selects a demodulation technique by evaluating the modulation output estimate and the given demodulation; generating a matching demodulation output in the modulation scheme classification means; sending the matching demodulation output to a means for signal demodulation to generate a demodulated signal; and simulating the non-cooperative signals without unwanted channel noise, disturbances and interference allowing a user to covertly identify and monitor the unknown transmission source with an improved fidelity and reliability. Many of the variations of the multi-sensor demodulation device also apply to this invention's methods.

It is to be further understood that other features and modifications to the foregoing detailed description are within the contemplation of the present invention, which is not limited by this detailed description. Those skilled in the art will readily appreciate that any number of configurations of the present invention and numerous modifications and combinations of materials, components, arrangements and dimensions can achieve the results described herein, without departing from the spirit and scope of this invention. Accordingly, the present invention should not be limited by the foregoing description, but only by the appended claims.

What I claim is:

1. A multi-sensor non-cooperative demodulation article of manufacture, comprising:
    a means for collecting signals and storing data receives a plurality of non-cooperative signals, s(t), from an unknown transmission source, said signal collecting means having a plurality of sensors, each of said sensors having a sampling clock and a local memory, and provides a plurality of received signals, said plurality of non-cooperative signals having a plurality of weak signals, a given modulation and a given demodulation;
    means for transmitting said plurality of received signals to a master sensor;
    a first one of said plurality of sensors having means for digitizing said plurality of received signals to provide a plurality of digitized signals to a signal fusion sensor;
    a means for data processing having a plurality of software programs and a storage medium encoded with machine-readable computer program code;
    a means for coarse estimation provides a coarse signal-to-noise ratio (SNR) estimation to extract said plurality of weak signals based on a coarse SNR threshold;
    a means for sorting sorts said plurality of digitized signals from high to low, and signals with a SNR below a given threshold are excluded;
    a means for normalization normalizes a plurality of digitized signals with an SNR above said given threshold to provide a plurality of digitized signals of high SNR above a given threshold to a means for signal labeling;
    said signal labeling means labels said plurality of digitized signals of high SNR above a given threshold from 1 to Nn based on a plurality of estimated SNR values;
    a means for correlating selects a maximum SNR, r1(k), from said plurality of high SNR above a given threshold digitized signals and correlates said maximum SNR with r2(k) from said plurality of high SNR above a given threshold digitized signals to obtain a delay factor;
    a means for calculating averages said r1(k) and in a continuous looping process;
    a means for generating and transmitting a combined digitized signal with said maximum SNR, r1(k), is generates and transmits said combined digitized signal to a means for automatic modulation for a modulation output estimate;
    said modulation output estimate is sent to a means for modulation scheme classification that selects a demodulation technique by evaluating said modulation output estimate and said given demodulation;
    a matching demodulation output is generated in said modulation scheme classification means;
    said matching demodulation output is sent to a means for signal demodulation to generate a demodulated signal; and
    said plurality of non-cooperative signals are simulated without unwanted channel noise, disturbances and interference allowing a user to covertly identify and monitor said unknown transmission source with an improved fidelity and reliability.

2. The multi-sensor non-cooperative demodulation article of manufacture, as recited in claim 1, further comprising a first one of said plurality of sensors digitizes a short time duration fragment of said plurality of received signals to a plurality of K samples.

3. The multi-sensor non-cooperative demodulation article of manufacture, as recited in claim 2, said signal collecting means further comprising said plurality of sensors storing said plurality of K samples in the local memory, said plurality of K samples being time-stamped.

4. The multi-sensor non-cooperative demodulation article of manufacture, as recited in claim 3, further comprising said plurality of sensors being said master sensor and a plurality of slave sensors.

5. The multi-sensor non-cooperative demodulation article of manufacture, as recited in claim 4, further comprising signal transmission between said plurality of slave sensors to said master sensor being asynchronous in time with a plurality of data fragments being sent as packets.

6. The multi-sensor non-cooperative demodulation article of manufacture, as recited in claim 5, further comprising signal transmission between said master sensors and said plurality of slave sensors being wireless.

* * * * *